(12) United States Patent
Popescu

(10) Patent No.: US 10,520,562 B2
(45) Date of Patent: Dec. 31, 2019

(54) MR AUDIO UNIT

(71) Applicant: Stefan Popescu, Erlangen (DE)

(72) Inventor: Stefan Popescu, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 103 days.

(21) Appl. No.: 15/793,191

(22) Filed: Oct. 25, 2017

(65) Prior Publication Data

US 2018/0113181 A1 Apr. 26, 2018

(30) Foreign Application Priority Data

Oct. 26, 2016 (EP) ..................................... 16195656

(51) Int. Cl.
*G01V 3/00* (2006.01)
*G01R 33/28* (2006.01)

(52) U.S. Cl.
CPC .................. *G01R 33/283* (2013.01)

(58) Field of Classification Search
CPC .. A61B 5/055; G01R 33/4828; G01R 33/543; G01R 33/5608; G01R 33/50
USPC ........................................................ 324/318
See application file for complete search history.

(56) References Cited

U.S. PATENT DOCUMENTS

| 5,552,708 | A | 9/1996 | Ham |
| 8,983,096 | B2 | 3/2015 | Smith et al. |
| 9,363,596 | B2 | 6/2016 | Dusan et al. |

| 2003/0103638 | A1 | 6/2003 | Boesen | |
| 2005/0197565 | A1 | 9/2005 | Yagi et al. | |
| 2007/0159169 | A1* | 7/2007 | Sellers ............... | G01R 33/3854 324/318 |
| 2008/0118077 | A1 | 5/2008 | Rasmussen | |
| 2010/0150385 | A1* | 6/2010 | Sporer ................. | H04R 25/405 381/313 |
| 2013/0156202 | A1* | 6/2013 | Hamacher ........... | H04R 25/453 381/23.1 |
| 2014/0111206 | A1 | 4/2014 | Kwon | |

(Continued)

FOREIGN PATENT DOCUMENTS

| EP | 2095144 B1 | 3/2014 |
| EP | 2095144 B1 | 3/2014 |

(Continued)

OTHER PUBLICATIONS

European Search Report for related European Application No. 16195656.0 dated May 12, 2017.

(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

The present embodiments relate to an audio unit for reducing an awareness of a noise produced by a magnetic resonance machine, to an audio system, to a magnetic resonance system, and to a method for operating an audio unit. The audio unit includes a vibration sensor unit, a control unit (e.g., a microcontroller), and at least one loudspeaker. The vibration sensor unit may be configured to detect signals transmitted by bone conduction, and may be configured to transmit the signals to the control unit. The control unit may be configured to control the at least one loudspeaker based on the transmitted signals.

26 Claims, 4 Drawing Sheets

(56) References Cited

U.S. PATENT DOCUMENTS

| | | | |
|---|---|---|---|
| 2014/0278220 A1* | 9/2014 | Yuen | G01B 21/16 |
| | | | 702/150 |
| 2014/0311499 A1 | 10/2014 | Lee et al. | |
| 2016/0118035 A1* | 4/2016 | Hyde | H04R 1/1083 |
| | | | 381/71.6 |
| 2016/0196698 A1* | 7/2016 | O'Dell | G07C 5/085 |
| | | | 701/33.4 |

FOREIGN PATENT DOCUMENTS

| | | |
|---|---|---|
| JP | 2005245580 A | 9/2005 |
| JP | 2014200609 A | 10/2014 |
| WO | WO2008062275 A1 | 5/2008 |

OTHER PUBLICATIONS

Korean Office Action for Korean Application No. 10-2017-0140289, dated Jul. 31, 2018, with English Translation.

\* cited by examiner

MR AUDIO UNIT

CROSS-REFERENCE TO RELATED APPLICATIONS

The present patent document claims the benefit of EP 16195656, filed on Oct. 26, 2016, which is hereby incorporated by reference in its entirety.

TECHNICAL FIELD

The present embodiments relate to an audio unit for reducing an awareness of a noise produced by a magnetic resonance machine, to an audio system and to a magnetic resonance system, and to a method for operating an audio unit.

BACKGROUND

Magnetic Resonance Imaging (MRI) is a known technique for producing images of inside a body of a patient and is based on the physical phenomenon of magnetic resonance (MR).

During a MR measurement, gradient coils in a gradient coil unit of a magnetic resonance machine are operated with short, high current pulses (e.g., of amplitude 600 Amperes and having rise and fall times of less than one microsecond). The short, high current pulses generate magnetic field gradients used for encoding signals that are essential to producing images.

In addition, typically a main magnet of the magnetic resonance machine generates a main magnetic field that is constant over time and on which the magnetic field gradients are superimposed. In this strong main magnetic field, the conductors of the gradient coils, through which the gradient currents are flowing, experience strong oscillating Lorenz forces. The strong oscillating Lorenz forces cause the gradient coil unit to vibrate and produces a loud audible sound (e.g., >100 dBA) inside the patient receiving zone and the examination room.

This loud audible sound usually causes unease and stress in the patient during the MR measurement (e.g., during prolonged MR pulse sequences). The result is often frustration of the patient and unintentional movements of the patient (e.g., which may reduce the image quality).

The methods for reducing the audible sound reaching the hearing organ of the patient during an MR measurement may be classified into passive and active methods. A passive method uses an additional acoustic barrier to reduce the noise experienced by the patient. These methods attenuate the external sound pressure by ear defenders or earplugs.

Alternative passive methods reduce sounds by damping materials or vacuum-filled sound absorbers used to reduce the inherent vibration of the magnetic resonance machine (e.g., inside the patient receiving zone where the patient is located).

The opportunities for reducing noise using passive methods are rather limited. Although passive methods are normally sufficient for lowering the sound pressure to a level that does not damage the hearing organ of the patient, passive methods are not adequate for preventing the associated unpleasantness for the patient during the MR measurement.

Active methods may supplement passive methods by using destructive interference to attenuate the audible sound further. Active methods may use an external loudspeaker positioned a long way away from the patient receiving zone of the magnetic resonance machine. A plastic tube is used to transfer destructively interfering sound waves from the loudspeaker to the patient receiving zone (e.g., to the ear of the patient).

This method may suffer from interference to the acoustic field and signal delays as a result of the long acoustic path. For high-frequency noise components, especially components above 1 kHz, interference and signal delays may not be eliminated effectively. In addition, the microphones that are normally used to pick up the noise inside the magnetic resonance machine are located so far from the ear of the patient that the noise actually occurring inside the ear of the patient is not picked up. Microphone location may also further limit the noise reduction capability.

SUMMARY AND DESCRIPTION

The scope of the present invention is defined solely by the appended claims and is not affected to any degree by the statements within this summary.

One or more of the present embodiments may obviate one or more of the drawbacks or limitations in the related art. For example, a device and a method may be provided to allow for better reduction of an awareness of a noise produced by a magnetic resonance machine.

An audio unit is provided for reducing an awareness of a noise produced by a magnetic resonance machine. The audio unit includes a vibration sensor unit, a control unit (e.g., a microcontroller), and at least one loudspeaker. The vibration sensor unit may be configured to detect signals transmitted by bone conduction, and to transmit the signals to the control unit. The control unit may also be configured to control the at least one loudspeaker based on the transmitted signals.

The vibration sensor unit may be configured to detect signals coupled into the vibration sensor unit via a solid body (e.g., the vibration sensor unit may be configured to not detect airborne sound, such as pressure oscillations in the air). As such, structure-borne sound is detected. The signal that detected by the vibration sensor unit is a mechanical oscillation (e.g., a mechanical vibration). The mechanical oscillation is not transmitted to the vibration sensor unit by air conduction (e.g., by transmission via a gaseous medium), but instead via a solid medium.

The vibration sensor unit is configured to detect mechanical vibrations that are produced by a magnetic resonance machine (e.g., by a gradient coil unit of a magnetic resonance machine). The mechanical vibrations are mainly transmitted via non-gaseous (e.g., solid) media between the source of the vibrations (e.g., gradient coils) and the vibration sensor unit. For instance, the vibrations are produced by gradient coils during an MR measurement, and are transmitted via a housing of the magnetic resonance machine to a patient couch. The vibration may be transmitted via the patient couch to the hearing organ of the patient (e.g., to the ossicles (lat. ossicula auditūs) and the cochlea) by bone conduction in the patient (e.g., via the cranium, the temporal bone (lat. os temporale) and/or the walls of the auditory canal).

The stimulation of the cochlea is achieved largely independent of the signals transmitted by air conduction through the auditory canal (lat. meatus acusticus) and are applied to the ossicles by the eardrum (lat. membrana tympani).

Because a large proportion of the disturbing noises caused by a magnetic resonance machine affect the patient via bone conduction, the signals detected by the vibration sensor unit may be used to take more effective corrective action to achieve noise reduction.

For example, the control unit may use the signals transmitted by bone conduction to determine a destructive interference signal output via the loudspeaker. The loudspeaker may be MR-compatible (e.g., is non-magnetic). Therefore, the awareness by the patient of the noise transmitted by bone conduction may be reduced or eliminated.

One embodiment of the audio unit provides that the vibration sensor unit includes at least one inertial sensor, at least one acceleration sensor, and/or at least one yaw-rate sensor. The aforementioned sensor types are suitable for detecting signals transmitted by bone conduction.

Acceleration sensors are often called accelerometers and/or G-force sensors. Acceleration sensors measure an acceleration by determining an inertial force acting on a test mass. For example, the inertial force may be used to determine whether the speed is increasing or decreasing. Based on this standard operating principle, acceleration sensors and yaw-rate sensors may be grouped under inertial sensors.

The vibration sensor unit may include at least one multi-axis acceleration sensor (e.g., a three-axis acceleration sensor). The multi-axis acceleration sensor may be used to acquire three signals (e.g., mutually orthogonal components of a total signal). For example, an x-component may be acquired in an x-direction, a y-component in a y-direction and a z-component in a z-direction. The x-, y- and z-directions are each orientated at right angles to one another.

Directional detection of the signals transmitted by bone conduction is provided (e.g., to determine not just an amplitude of a vibration but also a propagation direction of the vibration from which the vibration is arriving at the vibration sensor unit). This additional information may augment the potential ways the control unit analyzes the detected signal.

The control unit may be configured to separate out from the signal (e.g., detected by the multi-axis acceleration sensor) at least two signal components having different directions of propagation. The multi-axis acceleration sensor may acquire one signal component for each of a plurality of axes, and the separation is performed based on amplitudes and/or delays of the signal components. For example, the separation may be performed by cross-correlation analysis.

For example, because the direction of propagation of a vibration in the cranium and/or in the temporal bone differs according to the source of the vibration, signal components from different sources may be separated from the (total) signal.

For instance, a first vibration source may be the vocal chords (lat. plica vocalis) of the patient, and another vibration source may be a surface of a patient couch on which the patient is lying. Vibrations caused by the vocal chords of the patient (e.g., by the patient speaking) may propagate differently in terms of an x-, y- and z-direction compared with vibrations of the surface of the patient couch. The x-, y- and z-components of the signal acquired by the acceleration sensor exhibit specific amplitudes and/or delays depending on the location of the vibration source. For example, by separating the signals detected by the vibration sensor unit, it is possible to selectively suppress the disturbing vibrations that emanate from the patient couch. The vibrations coming from the vocal chords may not be suppressed, allowing the patient to hear himself speak.

The vibration sensor unit may be configured to detect mechanical vibrations in a frequency range between 15 Hz and 20 kHz (e.g., between 15 Hz and 1 kHz). In the aforementioned frequency range, a magnetic resonance machine produces particularly strong and/or disturbing vibrations that are transmitted by bone conduction.

One embodiment of the audio unit provides that the audio unit includes a first segment having a shape that is suitable for inserting the first segment into an (e.g., external), auditory canal of a patient (e.g., a human patient). In this embodiment, the vibration sensor unit is disposed in the first segment of the audio unit. The shape of the first segment may be suitable for providing that the first segment is seated firmly in the auditory canal. For this purpose, the first segment may include one or more elastic elements that may adapt to fit the shape of the auditory canal.

The vibration sensor unit may include a first external bounding surface that bounds the audio unit externally, and/or the audio unit includes a sound-conducting material having a second external bounding surface. The sound-conducting material may be arranged between the vibration sensor unit and the second external bounding surface. In an inserted state, the first external bounding surface and/or second external bounding surface touches a wall of the auditory canal.

By arranging the vibration sensor unit in mechanical contact (e.g., rigid mechanical contact) with the tissue of the auditory canal, the signals transmitted by bone conduction may be transmitted to the vibration sensor unit and/or be detected by the vibration sensor unit effectively.

The audio unit may be provided in the form of a headset (e.g., in the form of an earpiece). For example, the audio unit may be provided in the form of an in-ear earpiece, an in-ear headphone, an earbud earpiece, and/or a half-in-ear headphone.

The aforementioned forms of constructing the audio unit allows for a compact design and high patient comfort. The forms of construction do not restrict, or restrict only slightly, the freedom of movement of the head (e.g., rotation, etc.) compared with larger audio units (e.g., those of an earpad headset).

The audio unit may be smaller than 5 cm (e.g., smaller than 3 cm). For example, the electrical parts of the audio unit are arranged in a housing that is less than 5 centimeters (e.g., less than 3 cm) in extent. Thus, the maximum dimension and/or length of any electrical wires, antennas, and/or conductors inside the audio unit may be significantly shorter than the wavelength of the RF radiation typically used in an MR measurement, reducing the risk of inducing large electric fields and/or overheating the audio unit during an MR measurement.

Another embodiment provides that the audio unit includes at least one (e.g., MR-compatible) microphone configured to detect signals transmitted by air conduction and to transmit the signals to the control unit.

A microphone may be understood to be an acoustic transducer that converts airborne sound in the form of alternating sound pressure oscillations into corresponding voltage variations in the form of a microphone signal.

The at least one microphone may include a condenser microphone (e.g., an electret condenser microphone (ECM)). An electret is an electrically insulating material that contains quasi-permanently stored electric charges or quasi-permanently aligned electric dipoles, producing a quasi-permanent electric field internally or in the electret's surroundings. With an ECM, a polarizing voltage supply may not be needed.

The audio unit may include an internal microphone disposed in the first segment of the audio unit. The first segment has a shape suitable for inserting the first segment into an auditory canal. The internal microphone may be configured to detect sound that enters the auditory canal (e.g., the external auditory canal).

The audio unit may include, in addition to a first segment, a second segment. The second segment, upon insertion of the first segment into the auditory canal, is disposed outside the auditory canal. Because of limited space available inside the auditory canal, the second segment may be used to provide more space for fitting components of the audio unit.

The audio unit may include an external microphone disposed in the second segment of the audio unit. By virtue of its positioning, the external microphone may be configured for detecting external disturbing noises and/or the voice of the patient.

The internal microphone and/or the external microphone may be configured to detect signals transmitted by air conduction and to transmit the signals to the control unit.

The external microphone may include a microphone array. A microphone array (e.g., sometimes also referred to as an acoustic camera and/or acoustic antenna) may include a plurality of microphone elements (e.g., allowing beamforming). In this process, in-phase superposition of individual signals from the microphone elements may be used (e.g., to set a required directionality of the microphone array). The microphone array may be steered electronically. For example, electronic steering may be configured to adapt the external microphone according to the situation, such that the external microphone directivity is optimized to the situation.

The audio unit may include a first wireless transmission unit configured to detect and transmit to the control unit electromagnetic signals, and/or to emit signals received from the control unit as electromagnetic signals.

The first wireless transmission unit may be configured to transmit data between the audio unit and a possible external unit (e.g., a magnetic resonance machine) and/or an additional audio unit. The first wireless transmission unit may include at least one antenna used to transmit and/or receive the electromagnetic signals.

The wireless transmission unit may use an existing protocol that does not interfere with MR frequencies in order for the audio unit to achieve electromagnetic compatibility with the MR environment. For example, the wireless transmission unit works in the 2.4 GHz band (e.g., the 2.4 GHz ISM band (Industrial, Scientific and Medical band)). The 2.4 GHz ISM band is not licensed worldwide but is regulated nonetheless. A standardized RF protocol (e.g., Bluetooth) that employs frequency hopping spread spectrum (FHSS) RF technique may be used. As such, interference with the MR frequencies may be avoided.

At the frequencies specified above, the audio unit may be screened effectively against RF effects produced by operation of the magnetic resonance machine. In addition, eddy currents produced by the switching of the gradient fields may be reduced significantly by selective frequency filtering.

The audio unit may include at least one energy storage device. The energy storage device is configured to supply power to the control unit, to the first wireless transmission unit, and/or to other components of the audio unit.

For example, the at least one energy storage device may include a rechargeable battery (e.g., of largely non-magnetic design), a non-rechargeable battery (e.g., a long-life battery), and/or a capacitor (e.g., in the form of a high-capacitance dual-layer capacitor).

The energy storage device may provide for continuous operation of the audio unit. The energy storage device may be charged wirelessly (e.g., by energy harvesting of the RF power radiated by RF coils of the magnetic resonance machine).

In addition, an audio system including a first audio unit and a second audio unit are provided. The first audio unit is configured for a left ear of a patient, and the second audio unit is configured for a right ear of the patient. The first and second audio units may be symmetrical in shape to each other.

The first and second audio units may be configured to communicate with each other. Each of the two audio units may include a wireless transmission unit (e.g., electromagnetic signals may be transferred between the audio units).

For example, the first audio unit may include a first wireless transmission unit configured to transmit electromagnetic signals, and the second audio unit may include a second wireless transmission unit configured to transmit electromagnetic signals. The first wireless transmission unit is configured to receive signals transmitted by the second wireless transmission unit, and the second wireless transmission unit is configured to receive signals transmitted by the first wireless transmission unit.

For example, a signal detected by one or more of the sensors (e.g., the vibration sensor unit, the internal microphone and/or the external microphone) may be transmitted from the first audio unit to the second audio unit, and used to drive the at least one loudspeaker of the second audio unit.

A magnetic resonance system is provided including a magnetic resonance machine, an audio system and/or an audio unit. The magnetic resonance machine, the audio system and/or the audio unit may be configured to communicate with one another. An operator of the magnetic resonance machine is thereby able to converse with the patient.

In this case, the magnetic resonance machine may include an additional wireless transmission unit and a machine control unit. The additional wireless transmission unit is configured to detect and transmit to the machine control unit electromagnetic signals, and/or to transmit signals received from the machine control unit as electromagnetic signals.

In addition, various embodiments of methods for operating an audio unit are provided andmay be performed by the above-described audio unit, the audio system, and/or the magnetic resonance system. The method is not limited to operating a single audio unit and may be applied to an audio system including a plurality of audio units (e.g., an audio system including one audio unit for the left ear and an additional audio unit for the right ear of a patient).

The advantages of the devices explained in detail above may be applied to the embodiments of the methods described below, and vice versa. In other words, the claims relating to physical objects may also be provided by combining with the features described and/or claimed in connection with a method.

A method for operating an audio unit provided such that the audio unit is operated (e.g., operated in different operating modes) according to an operating state of a magnetic resonance machine (e.g., a gradient coil unit of the magnetic resonance machine). The facilities provided by the audio unit may be used optimally according to the method.

The different operating modes may include at least a voice communication mode and/or a noise reduction mode. In the noise reduction mode, the noise of the magnetic resonance machine that is unpleasant for the patient is reduced while the measurement is running. The voice communication mode is primarily configured for communication between an operator of the magnetic resonance machine and the patient located in the magnetic resonance machine.

A microphone (e.g., an external microphone) of the audio unit may detect, during a rest phase of the gradient coil unit of the magnetic resonance machine, an acoustic signal transmitted by a wireless transmission unit of the audio unit to a wireless transmission unit of the magnetic resonance machine and output by an output unit, and/or a signal is transmitted by the wireless transmission unit of the magnetic resonance machine to the wireless transmission unit of the audio unit and output by a loudspeaker of the audio unit.

The rest phase of the gradient coil unit may be a time period that the gradient coil unit is not operating. For example, the rest phase of the gradient coil unit may be a time period with no gradient current (e.g., no pulsed gradient current) is flowing through gradient coils of the gradient coil unit, and/or no magnetic field gradients are being generated by the gradient coil unit.

A rest phase does not ordinarily mean the short time intervals within an MR pulse sequence with no gradient pulse is actually applied (e.g., short time intervals often lie in the range of the repetition time TR). A time period of this type may be longer than 1 second (e.g., longer than 10 seconds). For example, a rest phase may occur before a MR measurment, during a MR measurement, and/or between different stages of a MR measurement.

The methods may be performed in a voice communication mode. The patient and the operator may converse with one another comfortably.

To reduce an awareness of a noise produced by the magnetic resonance machine during an operating phase of the gradient coil unit of the magnetic resonance machine, a loudspeaker signal may be produced by at least one loudspeaker of the audio unit.

The at least one loudspeaker may be driven by a control unit, as discussed above. To drive the at least one loudspeaker, the control unit uses signals that are detected by any sensors present (e.g., by the vibration sensor unit and/or by microphones), and transmitted to the control unit.

The operating phase of the gradient coil unit may be a time period that the gradient coil unit is operating. For example, the rest phase of the gradient coil unit may be one or more time periods that a gradient current (e.g., a pulsed gradient current) is flowing through the gradient coils, and/or magnetic field gradients are being generated by the gradient coil unit.

An operating phase may also include pauses (e.g., during pauses, no gradient current is actually flowing and/or no magnetic field gradients are being generated by the gradient coil unit). Such pauses may be defined by the MR pulse sequence being executed during the operating phase. For example, a MR pulse sequence may specify a sequence of gradient pulses and other events such as RF pulses. Pauses may arise between two consecutive gradient pulses with no generation of gradient current and/or magnetic field gradients by the gradient coil unit. The time length of such a pause often lies in the range of the repetition time TR of an MR pulse sequence. Such pauses may be less than 1 second (e.g., less than 0.1 second).

The loudspeaker signal may interfere with the sound waves acting on the hearing organ of the patient such that the sound waves (e.g., the amplitude of the sound waves) are reduced. This technique is referred to as destructive interference. The resultant perceived noise reduction may have a positive effect on the wellbeing of the patient.

For example, a vibration sensor unit of the audio unit detects a bone-conduction signal (e.g., transmitted by bone conduction) and the loudspeaker signal is generated based on the bond-conduction signal. The loudspeaker signal is generated based on minimizing the bone-conduction signal.

The sound waves acting on the hearing organ of the patient may be signals transmitted by bone conduction and the signals may be reduced effectively. In this process, the control unit of the audio unit may drive the loudspeakers to reduce the vibrations acting on the hearing organ of the patient. Otherwise, the vibrations would be experienced by the patient as an audible sound.

This process may reduce low-frequency components (e.g., components less than 1 kHz) of the noise caused by the magnetic resonance machine. The method may be effective in this frequency range.

An embodiment of the method provides that the loudspeaker signal is generated based on an assignment table (e.g., containing empirically obtained vibration patterns) assigned with cancellation patterns. The assignment table may be calibrated a priori using laboratory measurements (e.g., on human test subjects).

The bone-conduction signal may include a plurality of directional bone-conduction signals. The bone-conduction signal is separated into at least two components (e.g., into a voice component and a noise component) based on the plurality of directional bone-conduction signals.

The plurality of directional bone-conduction signals may be acquired using a multi-axis acceleration sensor, as discussed above.

One embodiment provides that, during a rest phase of the gradient coil unit of the magnetic resonance machine, bone-conduction signals are generated by the voice of a patient. For example, the bone-conduction signals are detected as training data by the vibration sensor unit, and used during an operating phase of the gradient coil unit of the magnetic resonance machine as the basis for separating the bone-conduction signal into the at least two components.

For example, during a rest phase of the gradient coil unit (e.g., in a voice communication mode) bone-conduction signals (e.g., directional bone-conduction signals) produced by a voice of a patient are acquired (e.g., using the multi-axis acceleration sensor). The bone-conduction signals are transmitted to the control unit. The control unit may be trained (e.g., with respect to the plurality of axes of the multi-axis acceleration sensor) with characteristic amplitudes and/or characteristic delays that are characteristic of the voice of the patient.

In a later operating phase of the gradient coil unit (e.g., in a noise reduction mode) the control unit may use the characteristic amplitudes and/or characteristic delays to separate the (e.g., directional) bone-conduction signals into at least two components (e.g., into a voice component and a noise component). The at least one loudspeaker may be driven such that the noise component is reduced and the voice component is not reduced.

In another embodiment, the characteristic amplitudes and/or characteristic delays may be transferred from a first audio unit to a second audio unit (e.g., by wireless transmission units) to further improve the separation of the bone-conduction signal.

During an operating phase of the gradient coil unit, a microphone (e.g., an internal microphone) of the audio unit may detect an internal acoustic signal inside an auditory canal. For example, the loudspeaker signal is generated based on the internal acoustic signal. The loudspeaker signal may be generated based on minimizing the internal acoustic signal.

The internal acoustic signal may be transmitted to the control unit of the audio unit. The audio unit processes the internal acoustic signal and drives the at least one loudspeaker signal to generate the loudspeaker signal.

The loudspeaker signal may be used to reduce effectively signals transmitted by air conduction. The at least one loudspeaker may be controlled by the control unit of the audio unit to reduce the airborne sound waves acting on the ear of the patient that would otherwise be experienced by the patient as an audible sound.

During an operating phase of the gradient coil unit, a microphone (e.g., an external microphone) of the audio unit may detect an external acoustic signal outside an auditory canal. The loudspeaker signal is generated based on the external acoustic signal.

In a similar manner to the internal acoustic signal, the external acoustic signal may be transmitted to the control unit of the audio unit. The audio unit processes the internal acoustic signal and drives the at least one loudspeaker signal to generate the loudspeaker signal. For example, the loudspeaker signal based on the external acoustic signal may be used to further reduce noises transmitted by air conduction.

The external acoustic signal may include a voice command of the patient. For example, the voice command may be used to set a noise reduction level and/or background music. In addition, the audio unit may detect, from the acoustic signal, unease and/or a panic attack of the patient, whereupon a warning may be issued to an operator of the magnetic resonance machine.

Another embodiment provides that a directivity of at least one (e.g., external) microphone is set based on an activity of the gradient coil unit. To alter the directivity of the at least one microphone, the at least one microphone may include a microphone array, as discussed above.

For example, during a rest phase of the gradient coil unit (e.g., in a voice communication mode) where the gradient coil unit is not applying any gradient pulses (e.g., no gradient current is flowing through the gradient coils of the gradient coil unit and/or no magnetic field gradients are being generated by the gradient coil unit), the directivity of the at least one microphone is set such that the microphone has an increased sensitivity in the direction of the speech organ of the patient.

During an operating phase of the gradient coil unit (e.g., in a noise reduction mode), the directivity of the at least one microphone may be synchronized with the activity of the gradient coil unit. For example, synchronization may be performed by providing the control unit of the audio unit with MR sequence data (e.g., at least some of an MR pulse sequence executed in the operating phase of the gradient coil unit). The control unit may also set the directivity of the at least one microphone. For example, the audio unit may steer a maximum spatial sensitivity of a microphone array into a desired direction (e.g., by amplifying and/or attenuating selected microphone elements of the microphone array). In addition, the microphone array may be set such that the microphone array has no sensitivity in a different direction. Setting of the directivity may also take into account an actual orientation of the head of the patient in the patient receiving zone (e.g., in a prone position, a supine position or a lateral position of the patient).

The directivity of the at least one microphone may be varied between at least two different directivities. For example, a first directivity may be set in a voice acquisition mode, and a second directivity may be set in a noise acquisition mode.

The voice acquisition mode may be set when the gradient coil unit is inactive (e.g., no gradient pulses are being applied). The first directivity may have a higher sensitivity in the direction of the speech organ of the patient. The at least one microphone may detect the voice of the patient more effectively (e.g., at a higher signal-to-noise ratio).

The noise acquisition mode may be set when the gradient coil unit is inactive (e.g., when no gradient pulses are being applied). The second directivity may have a different directivity from the first directivity. The at least one microphone may thereby pick up background noise (e.g., noise produced by the magnetic resonance machine) more effectively.

The operation of the audio unit may be synchronized with MR sequence data (e.g., by providing at least some of the MR pulse sequence to the audio unit). For example, the periodicity (e.g., a repetition rate TR, and/or the timing of the gradient pulses) that may characterize noises produced by the magnetic resonance machine are transmitted from the magnetic resonance machine to the audio unit.

For example, at least one loudspeaker of the audio unit may output acoustic signals (e.g., preventive signals) synchronously with an MR pulse sequence. For example, the acoustic signals may include music. For the purpose of outputting the preventive signals, the audio unit may include at least one loudspeaker for producing the preventive signals, a control unit for driving the loudspeaker, and a wireless transmission unit for transmitting any synchronization signals (e.g., MR sequence data) to the control unit. To output a preventive signal, the audio unit may not need to include sensors (e.g., a vibration sensor unit) and/or one or more microphones.

A preventive signal may be understood as an acoustic signal output in a time period before a predicted mechanical vibration produced by the magnetic resonance machine (e.g., by the gradient coil unit of the magnetic resonance machine). The control unit of the audio unit is may be configured to drive the at least one microphone to output the preventive signal. The volume of the preventive signal may be increased continuously (e.g., the volume rises) before the mechanical vibration is produced. The mechanical vibration may be predicted from a measurement of a variation of the noise produced by the magnetic resonance machine. The patient may be distracted effectively by the increasing volume, so that unintentional movements of the patient may be avoided. In addition, the preventative signal may protect the hearing of the patient by activating preventative biological mechanisms for protecting the hearing (e.g., the inner ear). This activation may be attained at significantly lower volumes than the volume produced by the gradient coil unit.

The magnetic resonance machine may transmit MR sequence data to the audio unit. The sequence data may be used to separate the signals acquired by the sensors of the audio unit.

For example, repeating phases that the gradient coil unit is inactive and then active again may be used to predict future noise output by using a pattern recognition technique. Pattern recognition data may be used to improve further the noise reduction and/or the separation of noise signals and voice signals.

A vibration sensor unit may detect a signal from which a movement and/or position of a patient head is ascertained. An MR measurement may be corrected based on the ascertained movement and/or position of the patient head.

For example, a multi-axis acceleration sensor may be used to acquire signals. The acquired signals may be transmitted wirelessly to the magnetic resonance machine. The acquired signals may be processed to establish changes in the head position during an MR measurement. For example, the acquired signals may be used to correct the MR measurement (e.g., the magnetic resonance measurement data) for the changes in the head position.

In addition, the ascertained movement and/or position may be used to take corrective action to counter the vibrations of the head (e.g., perceived as noise by the patient). For example, a position of the patient head relative to the surface of the patient couch where the patient is lying may be ascertained using signals from a multi-axis acceleration sensor.

A computer program product is disclosed. The computer program product may include a program that may be loaded directly into a memory of a programmable processing unit of a control unit of an audio unit. The program (e.g., libraries and auxiliary functions) may perform a method for operating an audio unit when the computer program product is executed in the control unit. The computer program product may include software containing a source code (e.g., to be compiled and linked or to be interpreted), or an executable software code (e.g., that, for execution, is loaded into the control unit). The method for operating the audio unit may be performed quickly, reproducibly and robustly by the computer program product. The computer program product may configured such that the computer program product may use the control unit to perform the method acts discussed above. Therefore, the control unit may have the necessary specification (e.g., suitable RAM or a suitable logic unit) to perform the respective method acts efficiently.

DETAILED DESCRIPTION

Figure 1:
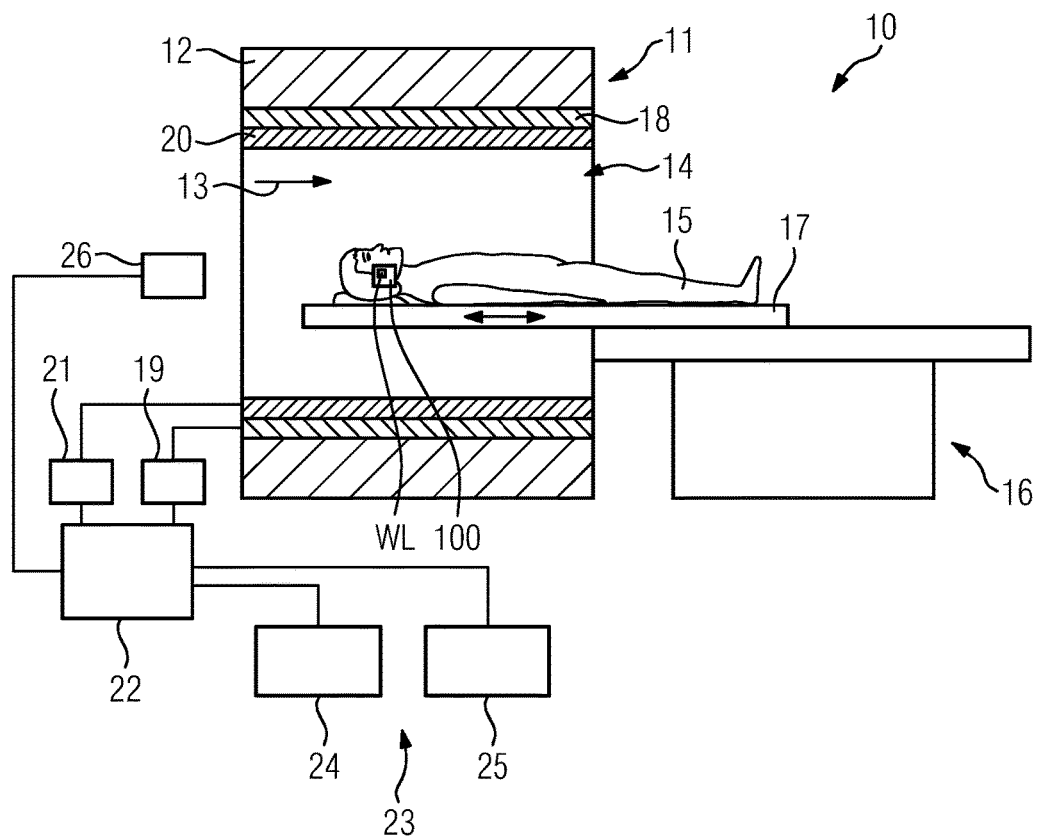
FIG. 1 is a schematic diagram of a magnetic resonance system including a magnetic resonance machine and an audio unit.

FIG. 1 shows a diagram of a magnetic resonance system including a magnetic resonance machine 10 and an audio unit 100. The magnetic resonance machine 10 includes a magnet unit 11. Magnet unit 11 includes a main magnet 12 for producing a powerful main magnetic field 13 (e.g., that is constant over time). The magnetic resonance machine 10 also includes a patient receiving zone 14 for accommodating a patient 15. In the present exemplary embodiment, the patient receiving zone 14 is shaped as a cylinder and is enclosed cylindrically in a circumferential direction by a cover of the magnet unit 11. The patient receiving zone 14 may have a different configuration. The patient 15 may be moved into the patient receiving zone 14 by a patient support apparatus 16 of the magnetic resonance machine 10. The patient support apparatus 16 includes a patient couch 17, configured to move inside the patient receiving zone 14.

The magnet unit 11 further includes a gradient coil unit 18 for generating magnetic field gradients (e.g., used for spatial encoding during imaging). The gradient coil unit 18 may include a plurality of gradient coils (e.g., not shown individually). Gradient currents produce the magnetic field gradients flowing through the gradient coils. Because the gradient currents normally flow through the gradient coils in pulsed form, the gradient currents are also referred to as gradient pulses. The gradient coil unit 18 is controlled by a gradient control unit 19 of the magnetic resonance machine 10.

The magnet unit 11 also includes an RF antenna unit 20. In the present exemplary embodiment, the RF antenna unit 20 is configured as a body coil that is permanently built into the magnetic resonance machine 10. The RF antenna unit 20 is configured to excite nuclear spins established in the main magnetic field 13 produced by the main magnet 12. The RF antenna unit 20 is controlled by an RF antenna control unit 21 of the magnetic resonance machine 10 and radiates RF pulses into an examination space. The examination space is largely formed by a patient receiving zone 14 of the magnetic resonance machine 10. The RF antenna unit 20 is also configured to receive magnetic resonance signals.

The magnetic resonance machine 10 includes a machine control unit 22 for controlling the main magnet 12, the gradient control unit 19 and the RF antenna control unit 21. The machine control unit 22 centrally controls the magnetic resonance machine 10 (e.g., controls the execution of a predetermined imaging gradient echo sequence). In addition, the machine control unit 22 includes an analysis unit (e.g., not shown specifically) for analyzing medical image data acquired during the magnetic resonance examination. In addition, the magnetic resonance machine 10 includes a user interface 23 connected to the machine control unit 22. Data (e.g., control data, such as imaging parameters) and reconstructed magnetic resonance images may be output to medical operating personnel by an output unit 24 (e.g., on a monitor or by a loudspeaker) of the user interface 23. In addition, the user interface 23 includes an input unit 25 used by the medical operating personnel to enter data and/or parameters during a measurement process.

The audio unit includes a first wireless transmission unit WL configured to detect and transmit electromagnetic signals. The magnetic resonance machine 10 also includes a further wireless transmission unit 26 connected to the machine control unit 22 and configured to detect and transmit electromagnetic signals. The magnetic resonance machine 10 and the audio unit may communicate with each other (e.g., to transfer data, such as signals) by the wireless transmission units WL, 26.

Figure 2:
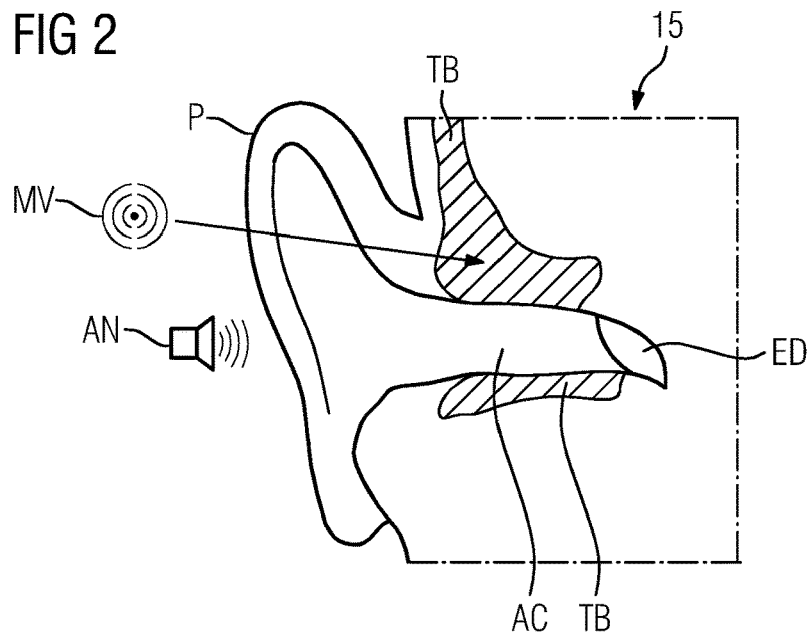
FIG. 2 is an illustration of various transmission paths of signals audible to a patient.

FIG. 2 illustrates various transmission paths of signals audible to the patient 15. For example, sound pressure waves AN may be transmitted via the air. Vibrations produced by the gradient coils cause vibrations of the cover of the magnet unit 11 that are converted into sound pressure waves AN inside the patient receiving zone 14. The sound pressure waves AN propagate by air conduction through the pinna P, via the auditory canal AC up to the eardrum ED that is stimulated to vibrate. The vibrations are transferred to the cochlea via the ossicles (e.g., not shown here), and converted by the cochlea into electrical signals that are sent to the brain of the patient 15.

Another transmission path is provided by bone conduction. Vibrations of the gradient coils cause mechanical vibrations MV of the patient couch 17 supporting the patient 15. The cochlea is ultimately stimulated via the surface of the patient couch, then subsequently via the cranium, the temporal bone TB and/or the wall of the auditory canal AC, etc. This stimulation is independent of the variations in air pressure inside the auditory canal.

Figure 3:
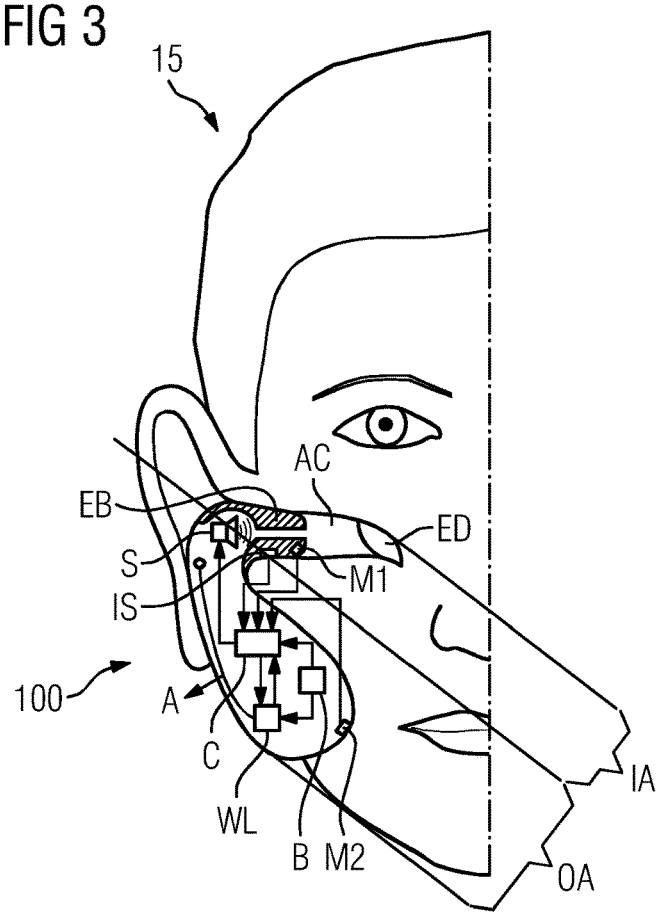
FIG. 3 is a schematic diagram of an audio unit.

FIG. 3 shows an audio unit 100 for reducing awareness of a noise produced by a magnetic resonance machine 10. The magnetic resonance machine includes an audio unit that takes into account at least one transmission path (e.g., or both transmission paths, such as air conduction and bone conduction).

The electrical wires, antennas, and/or conductors inside the audio unit may be significantly shorter than the wavelength of the RF radiation typically used in an MR measurement, such as if the audio unit is smaller than 5 cm (e.g., smaller than 3 cm).

The audio unit 100 includes a vibration sensor unit IS, a control unit C and a loudspeaker S. The vibration sensor unit IS is configured to detect signals MV transmitted by bone conduction and to transmit said signals to the control unit C. The control unit C may include analog and/or digital processing units (e.g., not shown here) in order to process the signals transmitted to the control unit. The control unit C is configured to drive the loudspeaker S based on the transmitted signals.

The audio unit may include a first wireless transmission unit WL configured to detect and transmit to the control unit C electromagnetic signals, and/or to emit signals received from the control unit C as electromagnetic signals. The wireless transmission unit WL includes an antenna A used to receive and emit the electromagnetic signals.

The audio unit 100 also includes an energy storage device B (e.g., a battery) that is connected to the control unit C and the wireless transmission unit WL and may supply the connected units with electrical power.

The vibration sensor unit IS may include at least one inertial sensor, at least one acceleration sensor, and/or at least one yaw-rate sensor. In an embodiment, as a multi-axis acceleration sensor, the vibration sensor unit IS may acquire signals used to deduce the source of the signal.

The vibration sensor unit is configured to detect mechanical vibrations MV at frequencies between 15 Hz and 20 kHz (e.g., between 15 Hz and 1 kHz) because the operation of the gradient coil unit 18 may may the frequencies strongly.

The audio unit 100 includes a first segment IA having a shape suitable for inserting the first segment into the auditory canal AC of the patient 15. The vibration sensor unit IS is arranged in the first segment IA of the audio unit 100. For example, the vibration sensor unit IS is arranged directly against the wall of the auditory canal AC such that the mechanical vibrations MV may be detected effectively. A sound-conducting intermediate layer may be arranged between the vibration sensor unit IS and the wall of the auditory canal.

The first segment may include an earbud EB and/or be in the form of an in-ear headphone and/or an earbud earpiece, allowing the audio unit 100 to be fastened firmly in the auditory canal AC of the patient 15.

The audio unit may include one or more microphones configured to detect signals AN transmitted by air conduction and to transmit the signals to the control unit C. In this example, the audio unit includes an internal microphone M1 and an external microphone M2. The internal microphone is disposed in the first segment IA. The internal microphone may be used to detect in the auditory canal AC the signals transmitted by air conduction.

The audio unit 100 includes, in addition to the first segment IA, a second segment OA. Upon insertion of the first segment IA into the auditory canal AC, the second segment OA is arranged outside the auditory canal AC. The external microphone M2 is arranged in the second segment OA of the audio unit 100.

Figure 5:
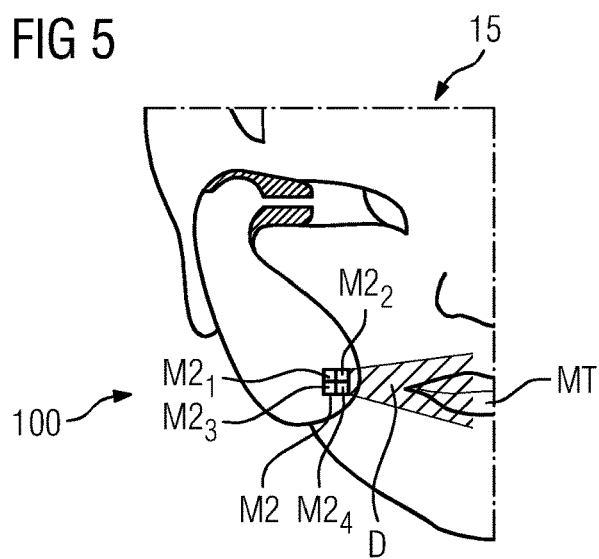
FIG. 5 is a schematic diagram of a directivity of a microphone array.

The external microphone M2 may include a microphone array (e.g., shown by way of example in FIG. 5). In this example, the microphone array includes four microphone elements $M2_1$, $M2_2$, $M2_3$, $M2_4$. A microphone array may include additional and/or fewer microphone elements. The directivity D may be controlled by driving the microphone array (e.g., by the control unit C). For example, the directivity D is set such that microphone has an increased relative sensitivity in the direction of the mouth MT and/or the voice of the patient. Voice signals from the patient 15 may thereby be detected by the external microphone M2 at an increased signal-to-noise ratio.

Figure 4:
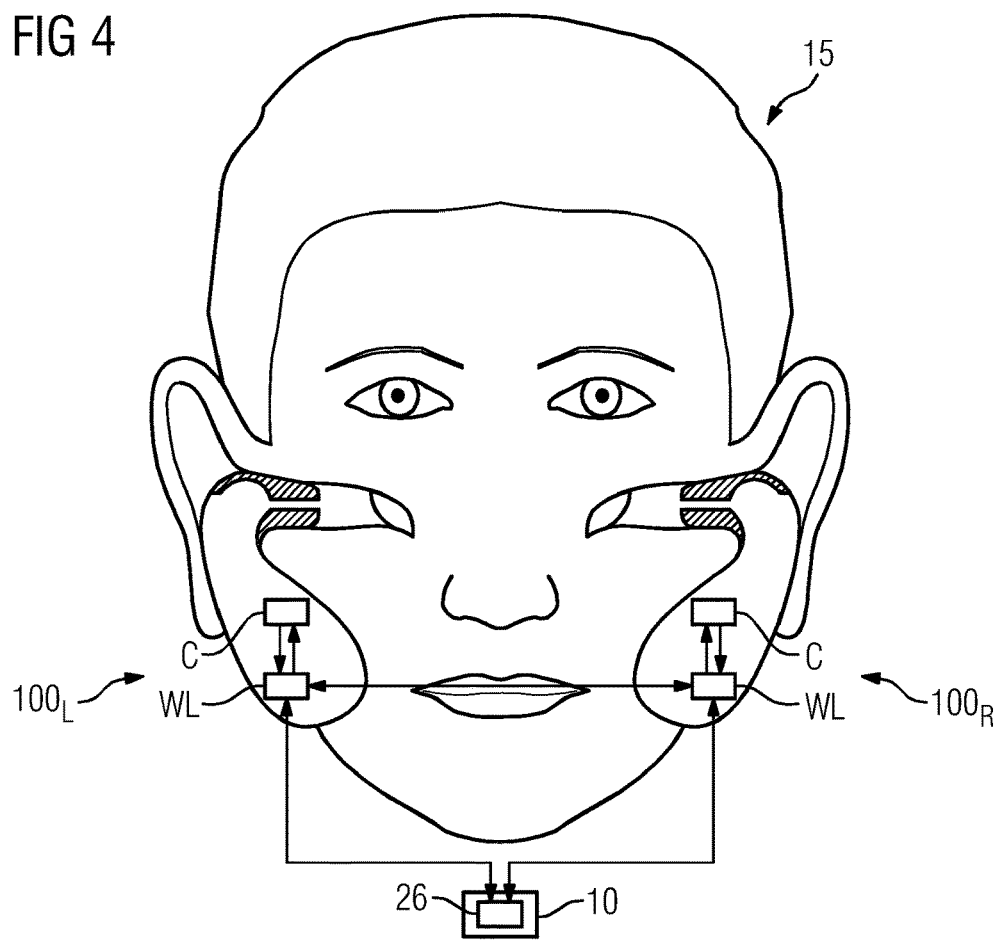
FIG. 4 is a schematic diagram of communication between an audio system and a magnetic resonance machine.

FIG. 4 shows an audio system including a first audio unit $100_L$ and a second audio unit $100_R$. Each of the audio units $100_L$, $100_R$ includes a wireless transmission unit WL for may communicating between the audio units $100_L$, $100_R$.

The audio units $100_L$, $100_R$ are able to communicate with each other and with the magnetic resonance machine 10 (e.g., including a wireless transmission unit 26). The magnetic resonance machine 10 forms a magnetic resonance system with the audio units $100_L$, $100_R$.

Figure 6:
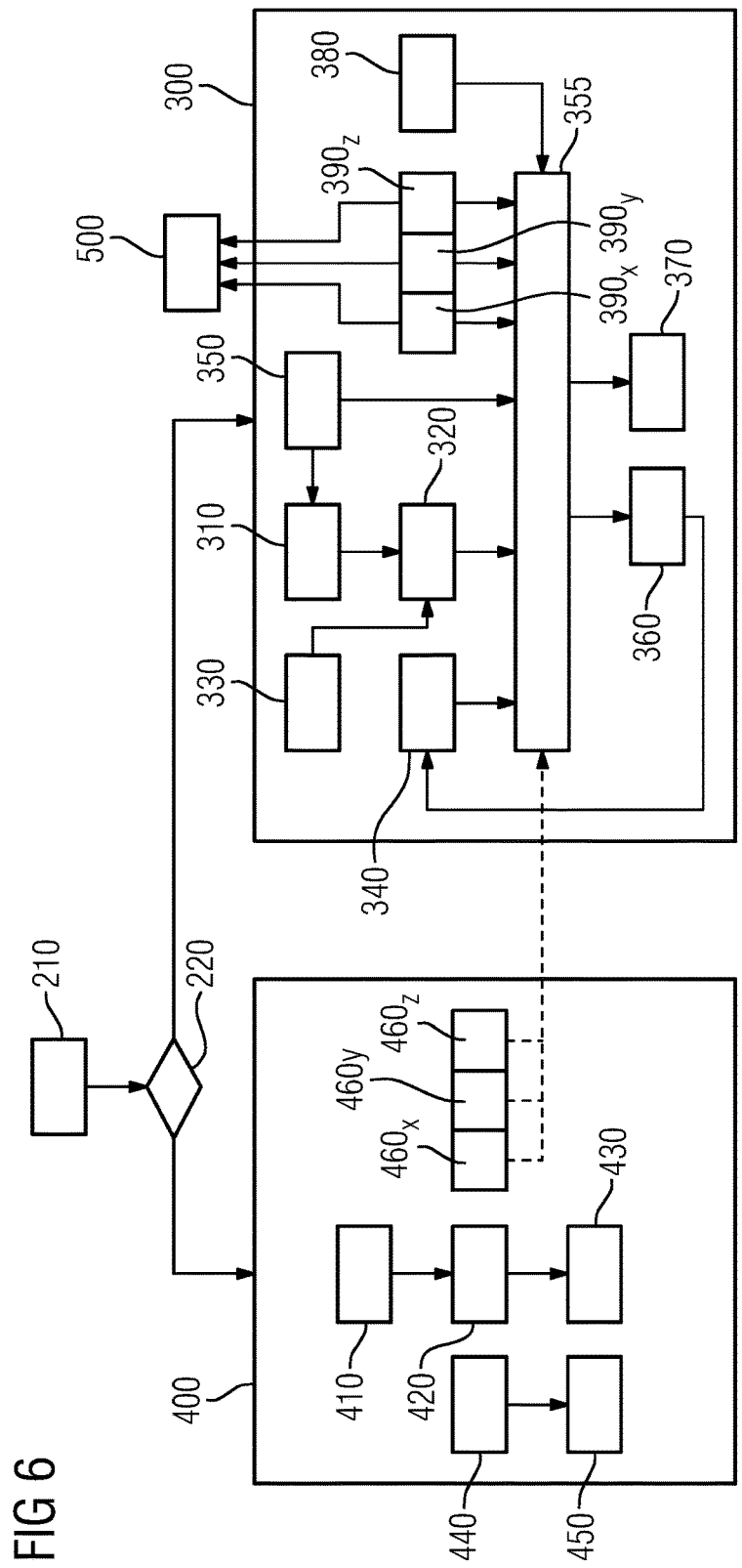
FIG. 6 is a block diagram of a method for operating an audio system.

FIG. 6 shows a method for operating an audio unit 100. In 210, an operating state of the gradient coil unit 18 of the magnetic resonance machine 10 is provided. Based on the operating state, in 220 a decision is made as to how to operate audio unit 100.

During a rest phase of the gradient coil unit 18 of the magnetic resonance machine 10, the audio unit 100 is operated in a voice communication mode 400. In voice communication mode 400, at 420, the external microphone M2 of the audio unit 100 detects an acoustic signal. At 430, the acoustic signal is transmitted by a wireless transmission unit WL of the audio unit 100 to a wireless transmission unit 26 of the magnetic resonance machine 10, and is output by the output unit 24. Optionally at 410, the directivity may be optimized beforehand for the voice communication mode 400 during which the gradient coil unit is inactive.

In addition, at 440, a signal is transmitted by the wireless transmission unit 26 of the magnetic resonance machine 10 to the wireless transmission unit WL of the audio unit 100. At 450, the signal is output by the loudspeaker S of the audio unit.

During an operating phase of the gradient coil unit 18 of the magnetic resonance machine 10, at 390*x*, 390*y*, 390*z*, the vibration sensor unit IS of the audio unit 100 detects a bone-conduction signal MV transmitted by bone conduction, and transmits the signal to the control unit C. For example, at 390*x* an x-component, at 390*y* a y-component, and at 390*z* a z-component of the bone-conduction signal MV is detected. Thus, the bone-conduction signal includes a plurality of directional bone-conduction signals. At 355, the signals transmitted to the control unit (e.g., the bone-conduction signal) are analyzed.

At 355, the bone-conduction signal may be separated into at least two components based on the plurality of directional bone-conduction signals. The separation is performed using bone-conduction signalsproduced at 460*x*, 460*y*, 460*z* during a rest phase of the gradient coil unit 18 of the magnetic resonance machine 10 by the voice of a patient 15 and detected by the vibration sensor unit IS.

Optionally, at 380, an assignment table may be provided to the control unit C. The assignment table may voice communication mode 400 empirically obtained vibration patterns with assigned cancellation patterns. This information may be processed by the control unit C at 355. For example, at 360, the cancellation patterns may be used to generate a suitable loudspeaker signal that cancels bone-conduction signal MV (e.g., reduces or even eliminates this signal).

Optionally, at 340, the internal microphone M1 of the audio unit 100 detects an internal acoustic signal inside the auditory canal AC. The loudspeaker signal is generated based on the internal acoustic signal. For example, at 355, the control unit C analyzes the internal acoustic signal, in addition to any other signals, and drives the loudspeaker S at 360 to generate a loudspeaker signal.

Optionally, at 340, the external microphone M2 of the audio unit 100 detects an external acoustic signal outside the auditory canal AC. The loudspeaker signal is generated based on the external acoustic signal. For example, at 355, the control unit C analyzes the internal acoustic signal, in addition to any other signals, and drives the loudspeaker S at 360 to generate a loudspeaker signal. The external acoustic signal may also voice communication mode 400 a voice command output at 330.

The operation of the audio unit 100 may be synchronized with MR sequence data provided at 350. For example, at 310 the MR sequence data may be used to set the directivity of the external microphone M2.

In addition, the loudspeaker S may output a preventive signal in a time period before a predicted mechanical vibration MV produced by the gradient coil unit 18 of the magnetic resonance machine 10.

The method described in detail above and the presented audio unit, the presented audio system and the presented magnetic resonance system are merely exemplary embodiments that may be modified by a person skilled in the art in many different ways without departing from the scope of the invention. In addition, the use of the indefinite article "a" or "an" does not rule out the possibility of there also being more than one of the features concerned. Likewise, the term "unit" does not exclude the possibility that the components in question consist of a plurality of interacting sub-components that may be spatially distributed if applicable.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An audio unit for reducing awareness of a noise produced by a magnetic resonance machine, the audio unit comprising:
   a vibration sensor unit;
   a control unit; and
   at least one loudspeaker,
   wherein the vibration sensor unit is configured to detect mechanical vibrations produced by the magnetic resonance machine and transmitted to a hearing organ of a patient by bone conduction, and
   wherein the control unit is configured to drive the at least one loudspeaker based on the mechanical vibrations to reduce the noise produced by the magnetic resonance machine via destructive interference.

2. The audio unit of claim 1, wherein the vibration sensor unit comprises at least one inertial sensor, at least one acceleration sensor, at least one yaw-rate sensor, or a combination thereof.

3. The audio unit of claim 1, wherein the vibration sensor unit comprises at least one multi-axis acceleration sensor.

4. The audio unit of claim 1, wherein the mechanical vibrations are at frequencies between 15 Hz and 20 kHz.

5. The audio unit of claim 1, wherein the audio unit comprises a first segment having a shape configured for inserting the first segment into an auditory canal of the patient,
   wherein the vibration sensor unit is disposed in the first segment of the audio unit.

6. The audio unit of claim 1, wherein the audio unit is smaller than 5 cm.

7. The audio unit of claim 1, wherein the audio unit comprises at least one microphone configured to detect acoustic signals transmitted by air conduction and configured to transmit the acoustic signals to the control unit.

8. The audio unit of claim 1, wherein the audio unit comprises a first segment having a shape configured to be inserted into an auditory canal of the patient,
   wherein the audio unit comprises an internal microphone disposed in the first segment of the audio unit,
   wherein the audio unit comprises a second segment, wherein upon insertion of the first segment into the auditory canal the second segment is arranged outside the auditory canal,
   wherein the audio unit comprises an external microphone disposed in the second segment of the audio unit,
   wherein the internal microphone and the external microphone are configured to detect acoustic signals transmitted by air conduction and to transmit the acoustic signals to the control unit.

9. The audio unit of claim 8, wherein the external microphone comprises a microphone array.

10. The audio unit of claim 1, wherein the audio unit comprises a first wireless transmission unit configured to detect and transmit electromagnetic signals to the control unit, to emit signals received from the control unit as electromagnetic signals, or to detect, transmit and emit electromagnetic signals to and from the control unit.

11. An audio system comprising:
    a first audio unit; and
    a second audio unit,
    wherein the first audio unit and second audio unit comprise:
       a vibration sensor unit;
       a control unit; and
       at least one loudspeaker,
       wherein the vibration sensor unit is configured to detect mechanical vibrations transmitted to a hearing organ of a patient by bone conduction, and
       wherein the control unit is configured to drive the at least one loudspeaker based on the mechanical vibrations to reduce noise via destructive interference.

12. The audio system of claim 11, wherein the first audio unit and the second audio unit are configured to communicate with each other.

13. A magnetic resonance system comprising:
    a magnetic resonance machine; and
    an audio system comprising:
       a first audio unit; and
       a second audio unit, wherein the first audio unit and second audio unit comprise:
a vibration sensor unit;
a control unit; and
at least one loudspeaker,
wherein the vibration sensor unit is configured to detect mechanical vibrations produced by the magnetic resonance machine and transmitted to a hearing organ of a patient by bone conduction, and
wherein the control unit is configured to drive the at least one loudspeaker based on the mechanical vibrations to reduce noise produced by the magnetic resonance machine via destructive interference.

14. The magnetic resonance system of claim 13, wherein the magnetic resonance machine, the audio system, the first and second audio units, or a combination thereof are configured to communicate with one another.

15. A method for operating an audio unit, the method comprising:
detecting, with a vibration sensor unit of the audio unit, mechanical vibrations produced by a gradient coil unit of a magnetic resonance machine during an operating phase of the gradient coil unit; and
generating, with at least one loudspeaker of the audio unit, a loudspeaker acoustic signal that interferes with the mechanical vibrations via destructive interference to reduce a noise produced by the gradient coil unit of the magnetic resonance machine.

16. The method of claim 15, wherein the mechanical vibrations comprise a plurality of directional bone-conduction signals, and
wherein the mechanical vibrations are separated into at least two components based on the plurality of directional bone-conduction signals.

17. The method of claim 16, further comprising:
generating, during a rest phase of the gradient coil unit of the magnetic resonance machine, bone-conduction signals by a voice of a patient, the voice of the patient detected by the vibration sensor unit and used during the operating phase of the gradient coil unit of the magnetic resonance machine for separating the bone-conduction signal into the at least two components.

18. The method of claim 15, further comprising:
detecting, with a microphone of the audio unit during the operating phase of the gradient coil unit, an internal acoustic signal inside an auditory canal of a patient,
wherein the loudspeaker acoustic signal is generated based on the internal acoustic signal.

19. The method of claim 15, further comprising:
detecting, by a microphone of the audio unit during the operating phase of the gradient coil unit, an external acoustic signal outside an auditory canal of a patient,
wherein the loudspeaker acoustic signal is generated based on the external acoustic signal.

20. The method of claim 19, wherein the external acoustic signal includes a voice command of the patient.

21. The method of claim 15, wherein during a rest phase of the gradient coil unit of the magnetic resonance machine, the method further comprises:
detecting, by at least one microphone of the audio unit, an acoustic signal, wherein the acoustic signal is transmitted by a wireless transmission unit of the audio unit to a wireless transmission unit of the magnetic resonance machine, and wherein the acoustic signal is output by an output unit, or
transmitting a signal by the wireless transmission unit of the magnetic resonance machine to the wireless transmission unit of the audio unit, and wherein the signal is output by the at least one loudspeaker of the audio unit.

22. The method of claim 18, wherein a directivity of at least one microphone is set based on an activity of the gradient coil unit.

23. The method of claim 15, wherein the operation of the audio unit is synchronized with MR sequence data.

24. The method of claim 23, wherein a preventive signal is output in a time period before a predicted mechanical vibration is produced by the gradient coil unit of the magnetic resonance machine.

25. The method of claim 15, wherein the vibration sensor unit of the audio unit detects a signal for ascertaining a movement, a position, or the movement and the position of a patient head is ascertained.

26. A computer program product comprising a computer program configured to be loaded directly into a non-transitory memory of a programmable processing unit of a control unit, the computer program, when executed, is configured to cause the control unit of a magnetic resonance machine to:
detect, with a vibration sensor unit of an audio unit, mechanical vibrations produced by a gradient coil unit of the magnetic resonance machine during an operating phase of the gradient coil unit; and
generate, with at least one loudspeaker of the audio unit, a loudspeaker acoustic signal that interferes with the mechanical vibrations via destructive interference to reduce a noise produced by the gradient coil unit of the magnetic resonance machine.

* * * * *